United States Patent [19]
Casper et al.

[11] Patent Number: 5,369,317
[45] Date of Patent: * Nov. 29, 1994

[54] CIRCUIT AND METHOD FOR CONTROLLING THE POTENTIAL OF A DIGIT LINE AND IN LIMITING SAID POTENTIAL TO A MAXIMUM VALUE

[75] Inventors: Stephen L. Casper; Stephen R. Porter, both of Boise, Id.

[73] Assignee: Micron Technology, Inc., Boise, Id.

[*] Notice: The portion of the term of this patent subsequent to Dec. 28, 2010 has been disclaimed.

[21] Appl. No.: 989,252

[22] Filed: Dec. 11, 1992

Related U.S. Application Data

[63] Continuation-in-part of Ser. No. 904,913, Jun. 26, 1992.

[51] Int. Cl.[5] ............................................. H03K 17/08
[52] U.S. Cl. .................................. 326/87; 365/189.09; 326/21; 327/543
[58] Field of Search ............ 307/443, 448, 451, 296.2, 307/296.8; 365/189.09

[56] References Cited

U.S. PATENT DOCUMENTS

| | | | |
|---|---|---|---|
| 4,473,762 | 9/1984 | Iwahashi et al. | 307/443 X |
| 4,567,378 | 1/1986 | Raver | 307/443 X |
| 4,585,955 | 4/1986 | Uchida | 307/443 X |
| 4,897,568 | 1/1990 | Chern et al. | 307/530 |
| 4,914,631 | 4/1990 | Johnson et al. | 365/189.11 |
| 4,924,442 | 5/1990 | Chen et al. | 365/189.11 |
| 5,038,325 | 8/1991 | Douglas et al. | 365/189.06 |
| 5,128,563 | 7/1992 | Hush et al. | 307/482 |
| 5,132,575 | 7/1992 | Chern | 307/530 |
| 5,274,276 | 12/1993 | Casper et al. | 307/443 |

*Primary Examiner*—David R. Hudspeth
*Attorney, Agent, or Firm*—Susan B. Collier

[57] ABSTRACT

The invention is a circuit and method for controlling a high potential at a significant node by controlling the potential at a control input to an electrical device in electrical communication with the significant node. The potential of the control input is controlled by a control circuit. In a first embodiment the control circuit is a potential generator, and in a second embodiment the control circuit is a programmable circuit. The programmable circuit provides a potential at the control input that is directly proportional to a supply potential until a maximum potential is reached at which time the control input is maintained at the maximum potential.

37 Claims, 10 Drawing Sheets

CIRCUIT AND METHOD FOR CONTROLLING THE POTENTIAL OF A DIGIT LINE AND IN LIMITING SAID POTENTIAL TO A MAXIMUM VALUE

CROSS-REFERENCE TO RELATED APPLICATION:

This application is a continuation-in-part of application Ser. No. 07/904,913, filed Jun. 26, 1992, entitled "An Output Driver Circuit Comprising a Programmable Circuit for Determining the Potential at the Output Node and the Method of Implementing the Circuit."

FIELD OF THE INVENTION

This invention relates to electronic circuits used to provide high potentials at a significant node. These circuits are of interest on semiconductor integrated circuits. More particularly, the invention relates to the output driver circuit of a dynamic random access memory (DRAM) device and the pull-up circuit in electrical communication with the digit line pairs.

BACKGROUND OF THE INVENTION

Memory Storage

A memory device stores digital data in an array of memory cells. Each memory cell has a specific address which is essentially the intersection formed by a wordline and a digit line. Once an individual cell has been selected, its true and complementary data is amplified and latched onto its digit line pair by a sense amplifier. The digit line pair comprises the "digit line" coupling true data and the "digit bar line" for coupling complementary data to and from the memory cell.

During an inactive cycle of the memory device the digit lines are typically equilibrated to the same potential, typically one half of the supply potential. However during an active cycle, when the data is stored in or retrieved from a memory cell, at least one of the digit lines is pulled to the supply potential, $V_{cc}$. Pull-up circuits of the related art are depicted in FIGS. 1A and 1B. The digit lines 1, having a p-channel sense amplifier 2, are pulled to the supply potential through the p-channel metal oxide semiconductor (PMOS) switching transistor 3 shown in FIG. 1A. The circuit is subject to large power consumption during the active cycle due to the large capacitance of the digit lines.

An alternate circuit implementation utilizes an n-channel metal oxide semiconductor (NMOS) switching transistors 4, see FIG. 1B. However, the incidence of soft error increases due to the voltage drop across the NMOS transistor 4. Soft error occurs at low supply potentials when the digit lines 1 are not pulled to a potential high enough to effectively couple a high potential to and from the memory cells. The PMOS transistor helps alleviate this problem. However since the PMOS transistor is fully conductive, as the supply potentials increase the current consumption increases. Thus, there is a need to minimize power consumption by reducing current while at the same time maintaining a valid high potential on the digit lines.

The Output Driver

It is necessary to transfer the data from each digit line to the output. This data transfer is accomplished by incorporating an output driver circuit into the DRAM. The output driver circuit 5, shown in FIG. 2, typically is a push-pull circuit arrangement comprising a pull-up portion 10 serially connected to a pull-down portion 15. The push-pull arrangement is conducive to low distortion, large load power and high efficiency. In operation the output driver circuit 5 is electrically interposed between the selected memory cell (not shown) and an external circuit 20 for receiving the data from the memory cell. The output driver circuit 5 is characterized as having a high input impedance and a low output impedance in order to drive the data with minimal loss to an external circuit 20.

1. A High Output

To drive a high logic level to the external circuit 20 the pull-up portion 10 of the circuit is activated and the pull-down portion 15 is deactivated thereby driving the output node 30 toward the high logic level of $V_{cc}$ while interrupting the current through the pull-down portion 15. The output driver circuit 5 then conducts current through the pull-up portion 10 between $V_{cc}$, at the supply node 31, and a reference potential in the external circuit 20.

2. A Low Output

Conversely when the data has a low logic level the pull-down portion 15 is activated and the pull-up portion 10 is deactivated. There is minimum potential loss across the pull-down portion 15, and the ground potential, $V_{ss}$, at the reference node 32 is driven to the output node 30 through the pull-down portion 15. The current in the pull-up portion 10 is interrupted. In this case when the output driver is connected to the external circuit 20 the output driver conducts current between the ground potential at the reference node 32 and a supply potential connected to the external circuit 20. When neither the pull-up portion 10 nor the pull-down portion 15 is activated a high impedance is present at the output node 30.

3. The Pull-Up Portion

Many configurations of pull-up portions have been implemented for output driver circuitries. FIG. 3A, 3B, 3C, and 3D are representative of a few of these pull-up circuits. In each of these examples the pull-down portion comprises an NMOS transistor.

A. The PMOS Transistor

In FIG. 3A the pull-up portion comprises a PMOS transistor 33. However utilizing the PMOS transistor as the pull-up portion has a significant limitation.

Problem

The circuit conducts a reverse leakage current if the potential at its drain exceeds the potential at its gate by more than the transistor threshold voltage ($V_t$). The output driver is often connected to an external circuit that is capable of generating a potential large enough to induce the reverse leakage current. Thus, significant reverse leakage current through the pull-up transistor may occur whenever excess potential from an external circuit is imposed upon the output node 34, regardless of whether the pull-up circuit is intentionally actuated.

B. The NMOS Transistor

In FIG. 3B the pull-up portion comprises an NMOS transistor 35, and in FIG. 3C the pull-up portion comprises two serially connected NMOS transistors 40 and 45. An advantage of this design is that the n-channel pull-up transistors effectively prevent any reverse leakage current from the output node 34. Thus, raising the potential at the output node does not forward bias the pull-up portion.

Problems

However, while the circuits of FIGS. 3B and 3C reduce or eliminate reverse current leakage, they create other problems which are detrimental to the efficiency of many integrated circuits. The problems are created by the turn-on threshold voltage of the NMOS pull-up transistor. For the pull-up transistor to conduct current it must maintain a potential equal to or greater than the threshold voltage, $V_t$, between its gate and its source. If the $V_{cc}$ approaches a minimum high logic level the final output potential may be an invalid high logic level. Also as the potential at the gate approaches $V_{cc}-V_t$, the pull-up transistors 35 or 45 begin to turn off. When the potential at the gate reaches $V_{cc}-V_t$ the pull-up transistor is completely off.

There are other problems encountered in either NMOS pull-up arrangement. First it is necessary to use large pull-up transistors for a total size in the range of 4500 microns. These large transistors require more space. Further, the use of NMOS transistors makes the circuit subject to negative input injection wherein the NMOS transistor can be actuated by negative potential on the output node.

C. The CMOS Transistor

One solution to some of the problems inherent in the circuits of FIGS. 3A–3C has been a circuit, shown in FIG. 3D, wherein the pull-up portion of the push-pull arrangement is implemented with a complementary metal oxide semiconductor (CMOS) transistor configuration comprising serially connected PMOS and NMOS transistors. The gates of the CMOS transistors receive inverted signals ensuring that both complementary transistors have the same on-off state. The CMOS design utilizes smaller transistors effecting a considerable die space savings over conventional NMOS push-pull arrangements. This design also helps to minimize negative input injection and reverse leakage current.

4. The Pull-Down NMOS

Although other pull-down circuits may be used the pull-down portion typically employed in FIGS. 3A, 3B, 3C, and 3D is an NMOS transistor 55 interposed between the output node 34 and the reference node 65. A high potential at the gate actuates the NMOS transistor 55 and couples the low logic level of the reference potential to the output node 34 through the NMOS transistor 55 when the current is interrupted in the pull-up portion.

Problem

External circuits have minimum and maximum parameters for defining both high and low logic levels. Potentials lying within the range of potentials set by these parameters are seen as either high or low logic levels depending on which logic level is being defined by the parameters. For the circuit of FIG. 3D the potential to which the output driver can drive the output node is limited by the threshold voltage of the pull-up transistor. This limitation consequence is particularly undesirable when an integrated circuit is required to operate with a very low supply potential. For instance, it is desirable in some cases to operate an integrated circuit at a circuit supply potential as low as 3.0 volts.

However, a high logic output signal at the output node is often specified to be no less than 2.4 volts. Achieving 2.4 volts at the output node with a circuit supply potential of 3.0 volts is either impossible or only marginally possible with standard n-channel transistors having threshold voltages of between 0.5 volts and 1.0 volts.

Conversely, in a case wherein the supply potential increases such that the potential at the output node would be higher than a maximum output parameter there exists a need to limit the potential at the output node.

Consequently there remains a need for an output driver circuit which provides the reverse output leakage prevention of an n-channel pull-up device while limiting the potential at the output node.

The following four patents may provide a further understanding of the related art and are herein incorporated by reference: U.S. Pat. No. 5,038,325, entitled High Efficiency Charge Pump Circuit, filed Mar. 26, 1990; U.S. Pat. No. 4,924,442, entitled Pull Up Circuit for Digit Lines in a Semiconductor Memory, filed Sep. 30, 1988; U.S. Pat. No. 4,914,631, entitled Pull Up Circuit for Sense Lines in a Semiconductor Memory, filed Sep. 30, 1988; and U.S. Pat. No. 5,128,563, entitled CMOS Bootstrapped Output Driver Method and Circuit, filed Nov. 28, 1990.

SUMMARY OF THE INVENTION

The invention is a control circuit and method for creating and controlling a significant potential at a significant node. The circuit of the invention creates and regulates the potential at a control input potential to an electrical device. The control input potential to the electrical device in turn determines the significant potential at the significant node.

In one application the control circuit is utilized to pull a digit line to a high potential. In this case the control circuit minimizes power consumption during pull-up of the digit line while preserving the integrity of the performance characteristics of the memory device. The control circuit is a programmable circuit capable of limiting the maximum potential to which the digit line is pulled, thereby minimizing power consumption. The circuit also allows the digit line to be pulled to full values of $V_{cc}$ for potentials less than the maximum potential, thereby minimizing soft error. In the digit line application a PMOS is electrically interposed between the significant node and a serial connection of the digit line and the digit bar line. When the PMOS transistor is activated the serial connection is pulled to the potential of the significant node.

In a further application the control circuit is used in conjunction with an output driver circuit. In this instance the significant node is the output node.

The output driver circuit is capable of driving a desired signal level to the output node. More particularly the circuit is capable of driving valid high logic levels to an output node irrespective of changes in the supply potential. The output driver circuit of the invention comprises a push-pull configuration wherein the pull-up portion comprises an NMOS transistor and wherein the control circuit is in electrical communication with the gate of the NMOS transistor.

The control circuit controlling the potential of the control input for the output driver may be a potential generator or a programmable circuit. The potential generator provides a pumped potential to the control input of the electrical device. The potential at the significant node is then equal to the pumped potential less a threshold voltage of the electrical device. The pumped potential at the control node eliminates latch up of the significant node. The programmable circuit provides a potential at the gate that varies with changes in the supply potential until a maximum value is reached. The programmable circuit then maintains the potential of the gate of the NMOS transistor at the maximum value for further changes in the supply potential.

DETAILED DESCRIPTION OF THE INVENTION

The barrier potential is the difference in potential across the depletion layer of a diode that must be overcome in order for the diode to conduct current.

Latch-up occurs when a node is inadvertently latched to a potential of another node. Latch-up of the output node to the potential of the supply node occurs in the output driver circuit when the potential at the drain of the PMOS transistor is great enough to forward bias the active area of the PMOS transistor. Reverse output leakage current is the current that flows in the output driver circuit due to the biasing of the PMOS transistor by a potential on the output node that is higher than a potential on the supply node. Under these conditions the diode formed by the n and p regions of the PMOS is biased when the potential difference between a potential of the external circuit and the potential of the supply node is equal to or greater than the barrier potential of the diode thus formed.

The threshold voltage ($V_t$) is the voltage that must be maintained between the gate and source of a metal oxide semiconductor (MOS) transistor in order for the transistor to conduct current.

Figure 1A:
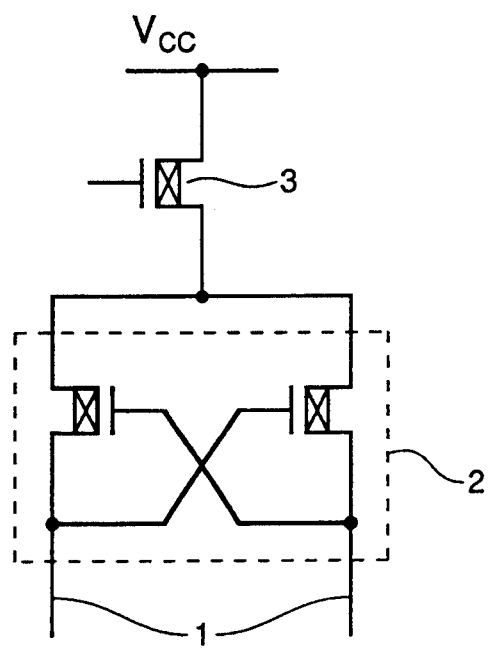
FIG. 1A is a schematic of a digit line pull-up circuit of the related art.
Figure 1B:
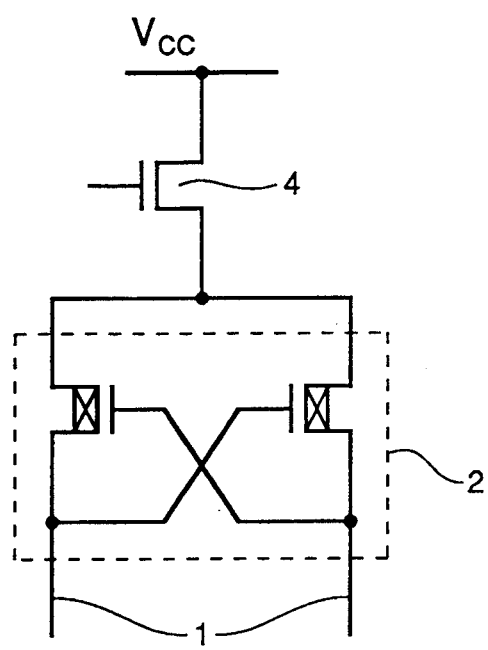
FIG. 1B is a schematic of a digit line pull-up circuit of the related art.
Figure 2:
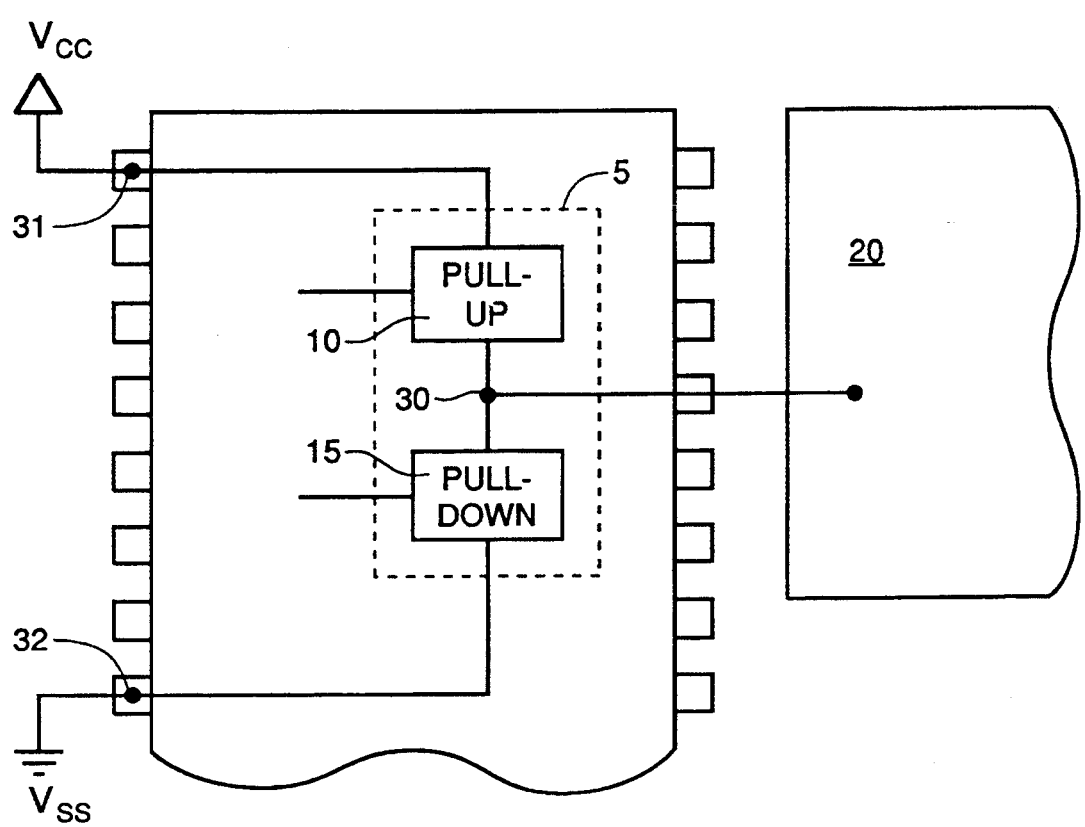
FIG. 2 is a block schematic of an output driver circuit wired in a push-pull configuration.
Figure 3B:
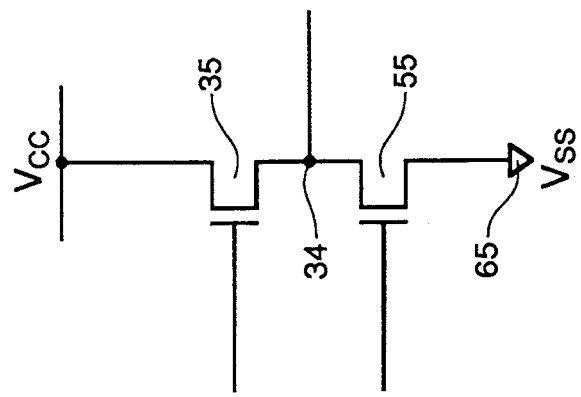
FIGS. 3A, 3B, 3C and 3D are schematics depicting various output driver circuits of the related art.
Figure 3A:
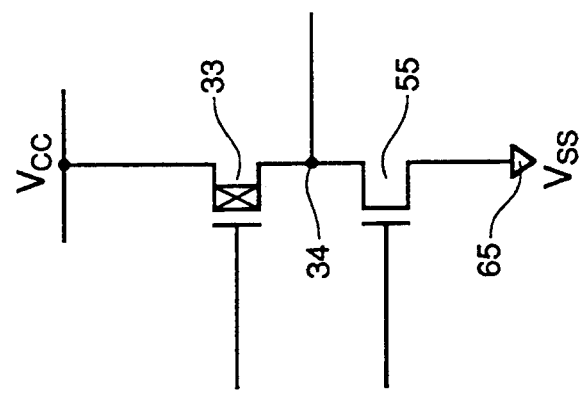
Figure 3D:
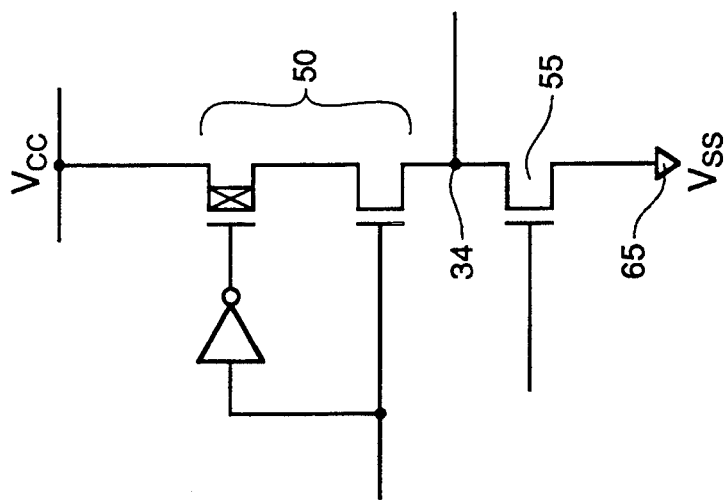
Figure 3C:
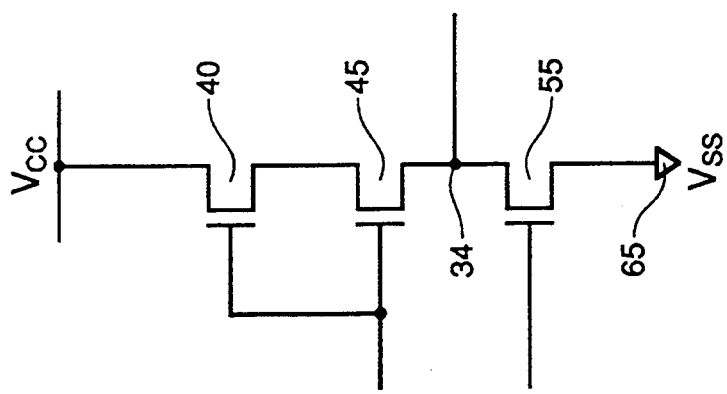
Figure 4:
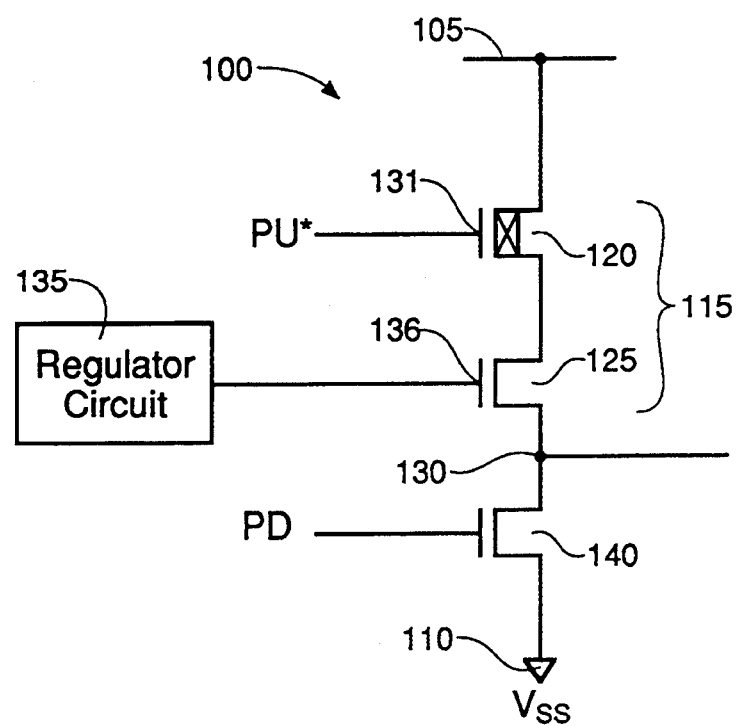
FIG. 4 is a schematic of the push-pull configuration and the control circuit of an output driver circuit of the invention.

FIG. 4 is a schematic of one embodiment of the invention. In this embodiment the invention comprises an output driver circuit 100 having a push-pull transistor configuration interposed between a supply node 105 and a reference node 110. The supply node 105 and the reference node 110 are connectable to a supply potential and a reference potential respectively. The supply potential is typically 3 to 5 volts and the reference potential is typically a ground potential of 0 volts. The push-pull configuration comprises a pull-up portion for driving the potential of the output node 1 toward a high logic level and comprising a pull-down portion for driving the potential of the output node toward a low logic level.

1. The Pull-Up Portion

CMOS configuration 115 comprising a PMOS transistor 120 and an NMOS transistor 125 comprises the pull-up portion of the embodiment. The PMOS transistor 120 is connected to the supply node 105 and serially connected to the NMOS transistor 125 which in turn is connected to the output node 130. The PMOS transistor 120 and the NMOS transistor 125 are gated by complementary signals. When the CMOS transistors 115 are actuated the potential of the output node is driven to a high logic level and when the CMOS transistors 115 are deactuated there is no current conduction between the output node 130 and the supply node 105. In this embodiment the PMOS transistor 120 is actuated by the complement of the pull-up control signal (PU*) at gate 131. PU* is typically the complement of the data to be driven to the output node 130. Therefore when a low potential gates the PMOS transistor 120 in conjunction with the actuation of the NMOS transistor 125 the potential of the output node 130 is driven to a potential having a high logic level.

2. The Control Circuit

In the output driver embodiment of the invention a control circuit 135 provides a potential at the gate node 136 of the NMOS transistor 125. The potential provided by the control circuit 135 actuates the NMOS transistor 125. In one embodiment the control circuit 135 is a potential generator providing a pumped potential. If the pumped potential is greater than the supply potential and remains a threshold above the supply potential the output node 130 remains at the supply potential. If the pumped potential is less than the supply potential the output node 130 is driven to a potential having a value equal to a potential a threshold vale below the pumped potential. Typical supply potentials are 5 volts and 3.0 volts, although it is conceivable that other values, even supply potentials larger than 5 volts, may be used.

In a second embodiment the control circuit 130 is a programmable circuit that provides a potential to the gate of the NMOS transistor 125 that is directly proportional to the potential of the supply potential until a programmed gate potential is reached. When the programmed gate potential is reached the control circuit 135 starts to clamp the potential of the output node 130 to a maximum potential.

3. The Pull-down Portion

The pull-down portion of the output driver circuit comprises an NMOS transistor 140 interposed between the output node 130 and the reference node 110. The NMOS transistor 140 is actuated by the pull-down control signal (PD) at its gate. When PD has a high logic level (the active state) the potential of the output node 130 is driven toward the reference potential through the actuated NMOS transistor 140. At the same time a high logic level on the gate of the PMOS transistor 120 deactuates the PMOS transistor 120 thereby interrupting the current path between the output node 130 and the supply node 105. Conversely when a low logic level activates the PMOS transistor 120 a low logic level on the control signal PD deactuates NMOS transistor 140 thereby interrupting current flow between the reference node 110 and the output node 130.

Many variations of pull-down portions are known and other implementations may be used without departing from the spirit and scope of the invention. One variation being the pull-down portion of the push-pull circuit described in allowed patent application entitled CMOS BOOTSTRAPPED OUTPUT DRIVER METHOD AND CIRCUIT, Ser. No. 07/619,164, filed which is herein incorporated by reference.

In the case where both the pull-up portion and the pull-down portion are deactuated the output node sees a high impedance.

Advantages

The output driver circuit of the invention provides output signals having valid high logic levels regardless of the value of the supply potential. This integrity of the high logic level is accomplished while retaining the comparatively quick response of a p-channel pull-up device (the PMOS transistor 120) while also providing the reverse output leakage prevention of an n-channel pull-up device (NMOS transistor 125). The control circuit also has the capability of reducing noise when the output driver is connected to relatively high supply potentials.

The Potential Generator

When the control circuit 135 is a potential generator used to provide the desired potential at the gate 136 the actual circuit implementation can vary. The exact circuit implementation depends on the desired output potential for a given supply potential. The potential generator is typically designed to provide a potential that effects minimal potential loss across the NMOS transistor 125. Therefore the gate 136 of the NMOS transistor 125 is biased at a pumped potential which is greater than or equal to the sum of the supply potential and the minimal threshold voltage required to actuate the NMOS transistor 125, and biased at a pumped potential that is less than or equal to the sum of the supply potential, the minimal threshold voltage required to actuate the NMOS transistor 125, and the barrier potential of the diode created between the p+ region and the n- well of the PMOS transistor 120. This parameter provides a pumped potential at gate 136 that assures that the PMOS transistor 120 won't go into latch-up, and it also ensures a minimal potential loss across the NMOS transistor 125.

Figure 5:
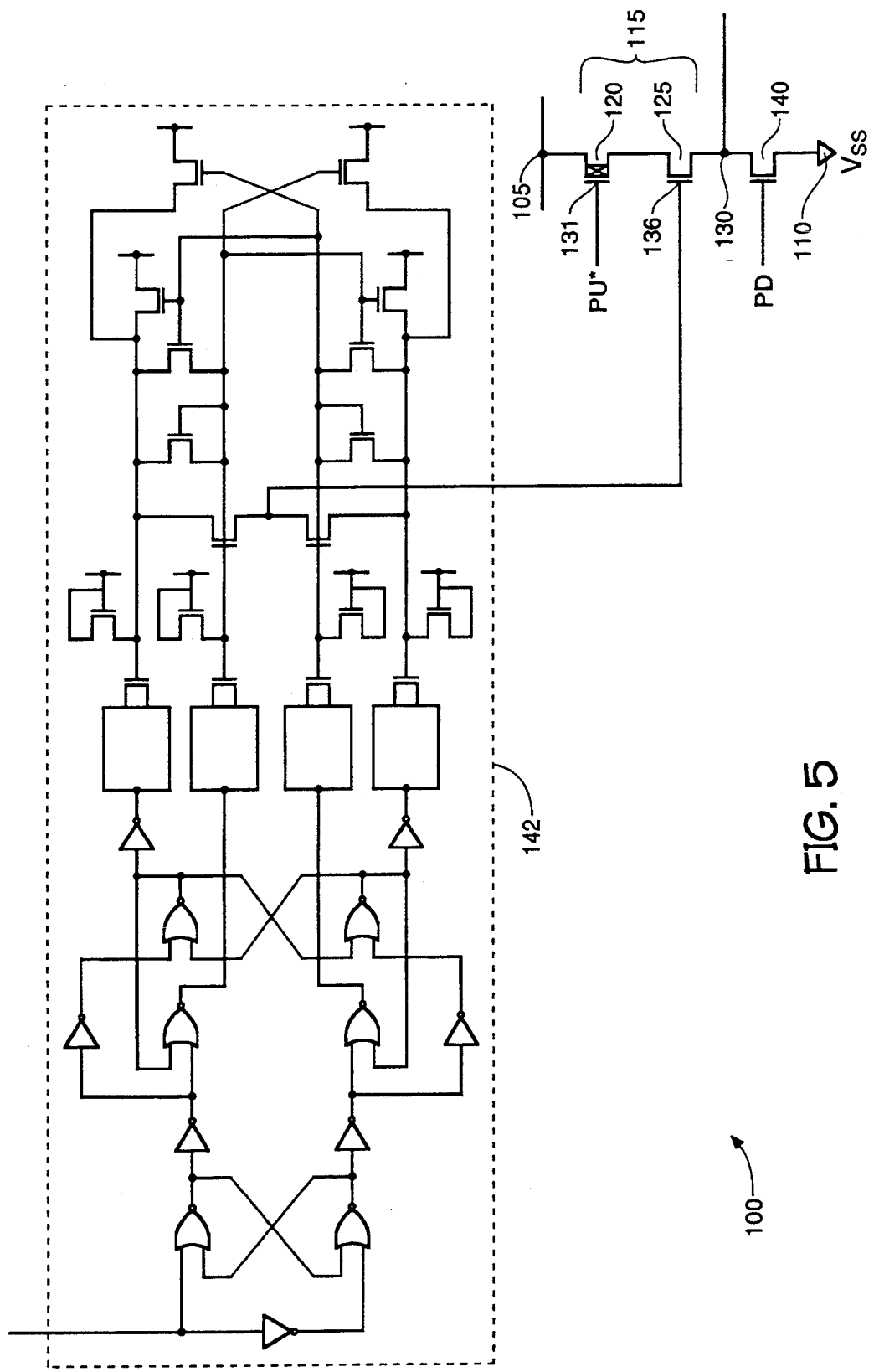
FIG. 5 is a more detailed schematic of the control circuit of FIG. 4 when the control circuit provides a pumped potential.

The pumped potential may either be an uninterrupted potential on gate node 136 or may be a potential clocked to gate node 136 to coincide with the active state of the input signal PU*. The designer may also take into account other design considerations such as power consumption and die space required. Potential generators are well known in the art and the actual circuit implementation is not critical. The simplified pump generator 142 shown in FIG. 5 is just one example of a pumped generator that may be used.

Therefore the potential generator provides a valid high logic level at the output node even for supply potentials having unusually low values thereby enhancing the reliability of the DRAM device.

The Programmable Circuit

Figure 6:
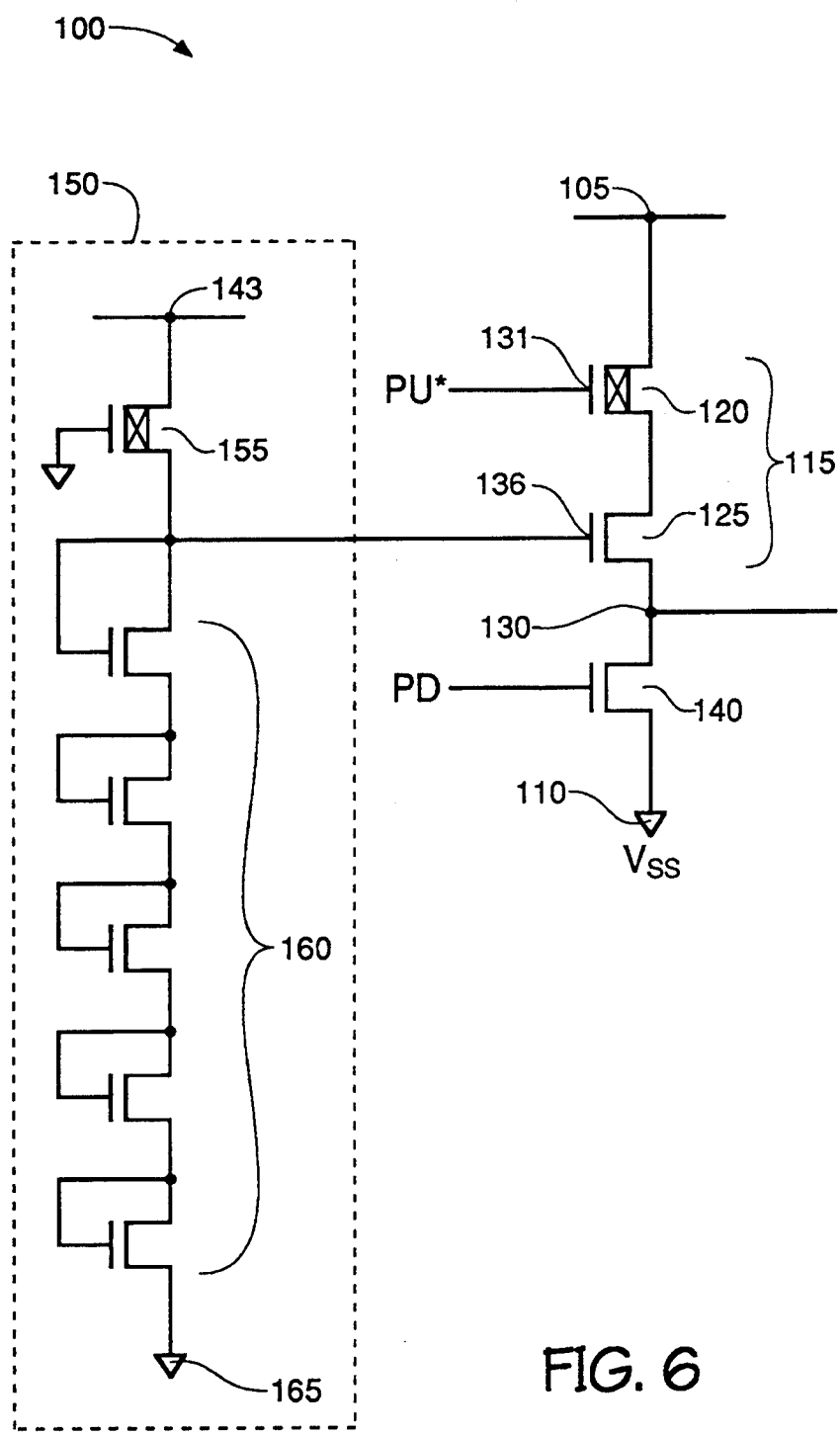
FIG. 6 is a more detailed schematic of the control circuit of FIG. 4 when the control circuit provides a programmable output.
Figure 7:
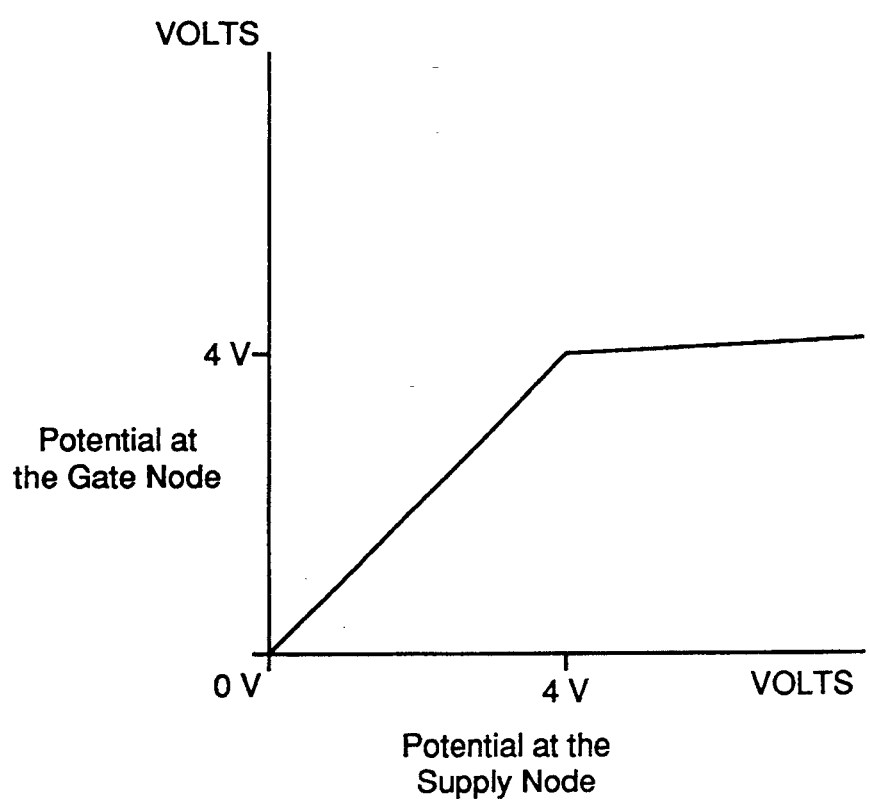
FIG. 7 is a graph relating the potential at the supply node to the potential at the gate of the NMOS transistor in the pull-up portion of FIG. 5.

Programmable circuits are well known in the art and the actual circuit implementation is not critical. The following example, shown in FIG. 6, is exemplary of a possible circuit implementation. FIG. 7 is a graphical simplification depicting the relationship between the potential of the gate node 136 and the potential of the supply node 143 for the programmable circuit 150 of FIG. 6. The programmable circuit 150 comprises a continually gated PMOS transistor 155 serially connected at the gate node 136 to five serially connected NMOS transistors. The five NMOS transistors are configured as diodes 160 by connecting the gate of each transistor to its respective drain. For this example assume each transistor has a barrier potential of 0.8 volts, therefore the total barrier potential that must be overcome to conduct current between the gate node 136 of the NMOS transistor 125 and the reference node 165 of the programmable circuit is 4 volts. Therefore when the supply potential at supply node 143 reaches approximately 4 volts the 5 diodes are capable of conducting current and the potential at the gate node is equal to 4 volts. Even though the supply potential increases the gate potential will be held at 4 volts due to the diodes 160. Up until the diodes 160 are capable of conducting current the programmable circuit behaves as a voltage follower circuit wherein the potential at the gate is directly proportional to the supply potential since the gate is pulled toward the supply potential through the continually gated PMOS transistor 155.

Therefore the programmable circuit allows the output potential to be directly proportional to the supply potential of the programmable circuit or directly proportional to the supply potential of the driver push-pull configuration when the two supply nodes 143 and 105 are electrically connected. By limiting the gate potential to a maximum value the programmable circuit also limits the output potential to a maximum predetermined potential. The maximum predetermined potential is typically a valid high logic level. The programmable circuit maintains the maximum predetermined potential at the output node even as the supply potential increases beyond a valid high logic level.

The above example is only one type of programmable circuit that may be used. Another option could allow the gate potential at gate node 136 to follow the supply potential of the control circuit and then utilize a potential generator to provide a pumped potential thereby limiting the potential of the gate node 136 to a maximum value equal to the pumped potential.

Figure 8A:
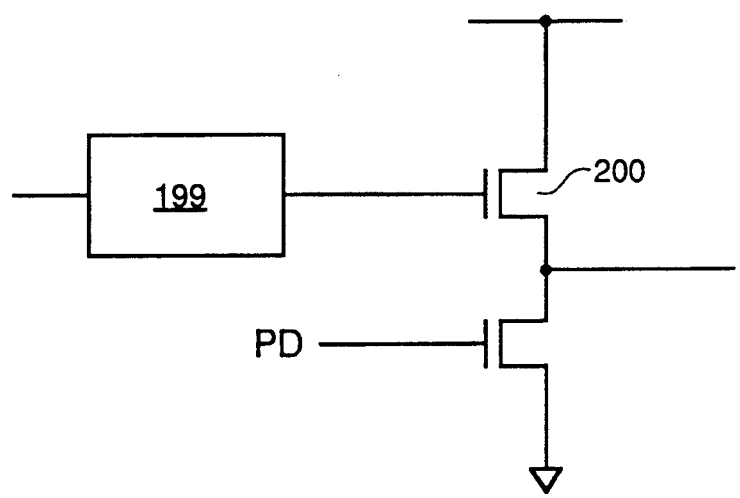
FIGS. 8A and 8B are alternate embodiments of the circuit of FIG. 6.
Figure 8B:
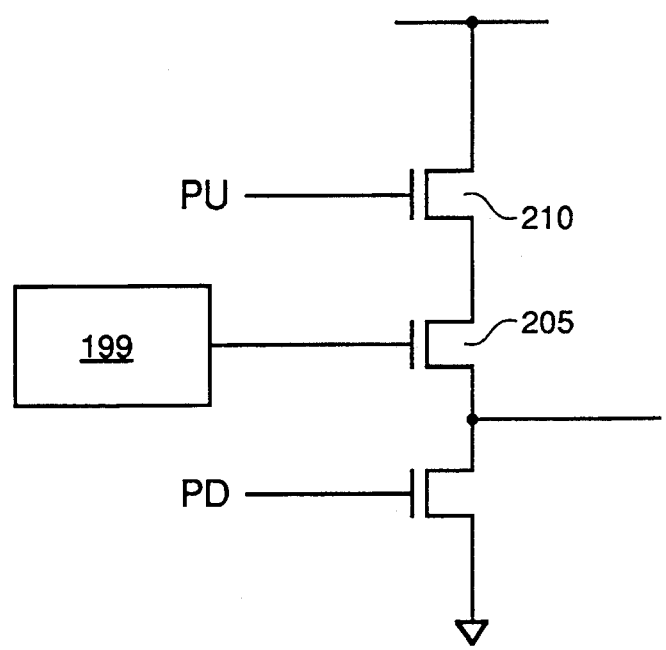

FIGS. 8A and 8B depict some examples of possible alternate embodiments of the output driver circuit using a programmable circuit 199. The pull-up portion of the circuit may incorporate just the NMOS transistor 200 as shown in FIG. 8A or two serially connected NMOS transistors 205 and 210 as shown in FIG. 8B 205 and 210. In the case of FIG. 8A where only one NMOS transistor 200 is implemented in the pull-up portion, the NMOS transistor 200 is responsive to a pull-up signal in order to drive the required data to the output node. In the alternate case wherein the two transistors 205 and 210 form the pull-up portion either or both may be responsive to the pull-up signal. Other variations and modifications may be made to the pull up portion of the circuit by those skilled in the art without departing from the spirit and scope of the invention.

Thus, it is apparent that there has been provided, in accordance with the invention, an improved output driver circuit which retains a valid high logic level for variable values of $V_{cc}$, eliminates latch up and eliminates reverse output leakage current.

Figure 9:
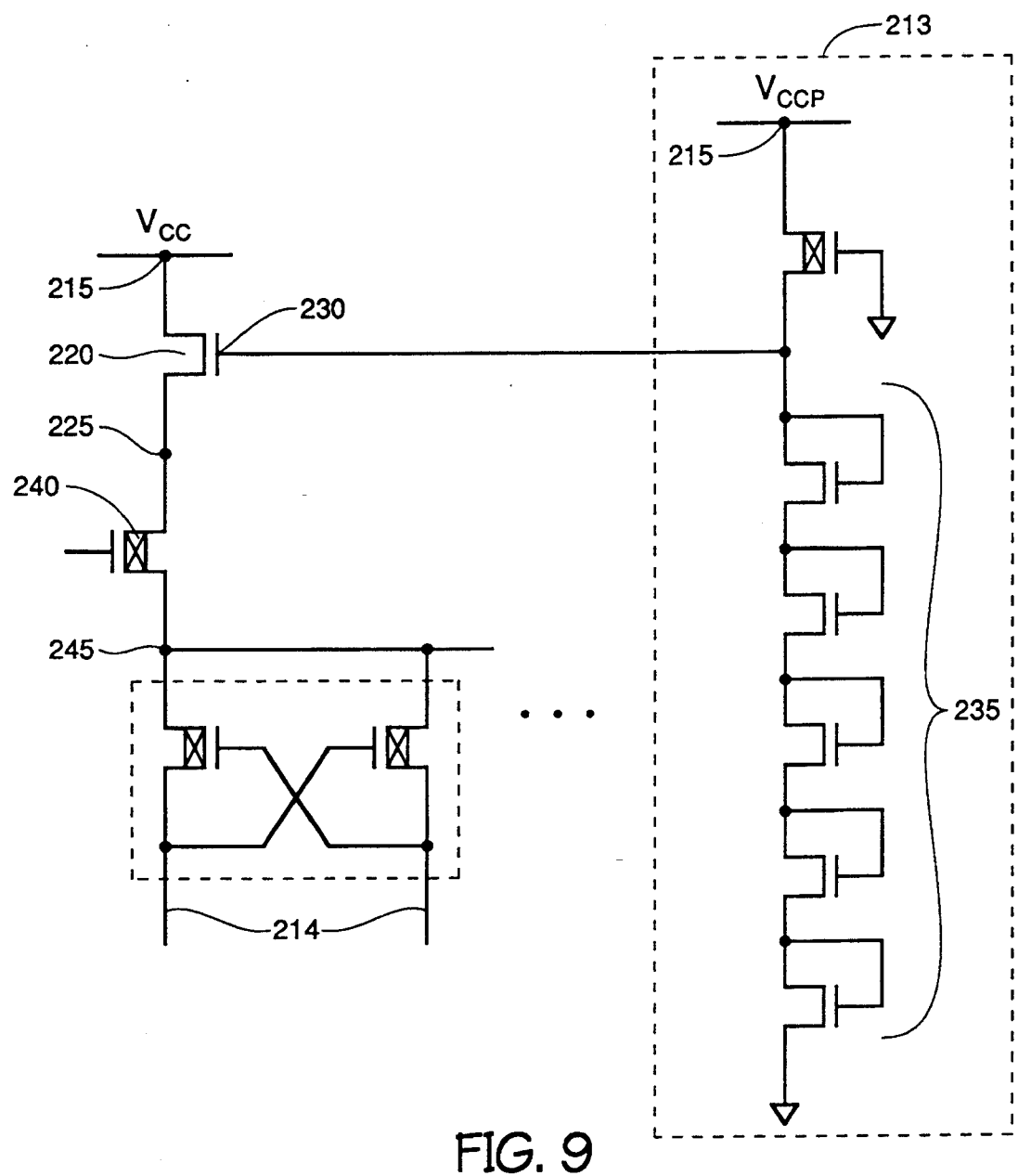
FIG. 9 is an schematic of a digit line pair and the programmable control circuit of the invention.

In a further embodiment, the invention is a control circuit for controlling the high potential to which a digit line is pulled during the active cycle of the DRAM. FIG. 9 is a schematic depicting a programmable circuit 213 designed to control the high potential driven to the digit lines 214. Although the potential at node $V_{ccp}$ 215 can be equal to the supply potential, $V_{cc}$, it is typically pumped to a value equal to or greater than $V_{cc}$ plus a threshold potential of transistor 220. This pumped potential allows transistor 220 to conduct current fully and to pull the significant node 225 to the full supply potential. The potential at gate node 230 is regulated at a maximum potential by the diode chain 235. Since the circuit is designed such that the potential at node $V_{ccp}$ 215 increases directly as $V_{cc}$ increases, when $V_{ccp}$ is large enough to allow the diode chain 235 to conduct current, the potential at gate node 230 is regulated at a maximum value equal to the potential across the diode chain 235. Significant node 225 is therefore regulated at a potential a threshold value less than the maximum potential at node 230. Transistor 240 is activated during the active cycle thereby providing electrical communication between the significant node 225 and the digit lines 214.

Since transistor 240 is fully conductive, full values of $V_{cc}$ are coupled through transistors 220 and 240 when the regulated potential at node 230 is a threshold voltage (of transistor 220) greater than $V_{cc}$. Since full values of $V_{cc}$ are coupled to the digit lines 214 soft error is minimized. When the significant node 225 reaches its maximum potential, which is equal to the regulated potential minus the threshold voltage of transistor 220, further increases in the supply potential are not felt at the digit lines and a significant current savings is realized.

Thus it is apparent that there has been provided, in accordance with the invention, an improved pull-up circuit for pulling a digit line to a maximum value at low operating potentials while minimizing power consumption at high operating potentials.

Although the control circuit of the invention has been described in terms of controlling a digit line potential of a DRAM and for controlling a high output potential to an output pad of a DRAM, the circuit has utility in other circuits where it is desired to control the potential at a node. It will be apparent to those skilled in the art that the programmable circuit disclosed in detail herein may be modified in numerous ways and may assume many embodiments other than those specifically set out and described above. Accordingly, it is intended by the appended claims to cover all modifications of the invention which fall within the true spirit and scope of the invention.

What is claimed is:

1. A circuit for pulling a significant node to a significant node potential, comprising:
    a) a first supply node connectable to a first supply potential having a digital logic level;
    b) an electrical device electrically interposed between said first supply node and the significant node, said electrical device having a control input; and
    c) a second supply node connectable to a second supply potential; and
    d) a control circuit having a voltage follower device, said voltage follower device electrically interposed between said second supply node and said control input, said control circuit creating a control potential at said control input of said electrical device, wherein said control potential is capable of activating said electrical device thereby allowing said significant node potential to be pulled toward said digital logic level of said first supply potential, said control circuit 2. The circuit as specified in claim 1, wherein said voltage follower device adjusts said control potential to have a linear relationship with said second supply potential.

3. The circuit as specified in claim 1, wherein said second supply potential is at least equal to said first supply potential plus a threshold potential of said electrical device, said threshold potential that potential that must be maintained between said control input and the significant node in order for said electrical device to conduct current.

4. The circuit as specified in claim 1, wherein said control circuit further comprises a limiting device in electrical communication with said control input, said limiting device limiting said control potential to a maximum value, said maximum value of said control potential thereby limiting said significant node potential to a maximum value.

5. The circuit as specified in claim 1, further comprising a switching device serially connected to said electrical device and capable of interrupting a current flow in said electrical device when deactuated.

6. The circuit as specified in claim 5, wherein said switching device experiences minimal potential loss when actuated.

7. The circuit as specified in claim 1, further comprising a digit line in electrical communication with said significant node.

8. A circuit for pulling a significant node to a significant node potential, comprising:
    a) a supply node connectable to a supply potential having a digital logic level;
    b) an electrical device electrically interposed between said supply node and the significant node, said electrical device having a control input; and
    c) a control circuit for creating a control potential at said control input of said electrical device, wherein said control potential is capable of activating said electrical device thereby allowing said significant node potential to be pulled toward a potential having said digital logic level of said supply potential, said control circuit adjusting said control potential to control a value of said significant node potential and limiting said control potential to a maximum value, said maximum value of said control potential thereby limiting said significant node potential to a maximum value.

9. The circuit as specified in claim 8, wherein the maximum value of said significant node potential is equal to the maximum value of said control potential minus a threshold potential of said electrical device.

10. The circuit as specified in claim 8, wherein said control circuit comprises a limiting device electrically interposed between said control input and a reference node connectable to a reference potential, said maximum value of said control potential equal to the potential necessary at said control input in order that said limiting device conducts current.

11. The circuit as specified in claim 8, wherein said significant node potential is substantially equal to said supply potential for said significant node potential having a value less than the maximum value of said significant node potential.

12. The circuit as specified in claim 8, further comprising a digit line in electrical communication with said significant node.

13. The circuit as specified in claim 8, further comprising a switching device serially connected to said electrical device and capable of interrupting a current flow in said electrical device when deactuated.

14. A circuit for pulling a significant node to a significant node potential, comprising:
   a) a supply node connectable to a supply potential having a digital logic level;
   b) an electrical device electrically interposed between said supply node and the significant node, said electrical device having a control input; and
   c) a potential generator for generating a pumped potential at said control input having a value necessary to actuate said electrical device and drive said significant node to said significant node potential.

15. The circuit as specified in claim 14, wherein said pumped potential is substantially stable.

16. The circuit as specified in claim 14, wherein said pumped potential is substantially stable.

17. The circuit as specified in claim 14, further comprising a digit line in electrical communication with said significant node.

18. The circuit as specified in claim 14, further comprising a switching device serially connected to said electrical device and capable of interrupting a current flow in said electrical device when deactuated.

19. A method of driving a significant potential to a significant node comprising the following steps:
   a) connecting a supply potential to a supply node;
   b) creacting a control potential at a control node;
   c) regulating a value of said control potential to control a value of said significant potential;
   d) actuating a driving device with said control potential in order to allow an electric current to flow between said significant node and said supply node; and
   e) clocking said control potential to said control node such that said control potential is applied to said control node intermittently.

20. The method as specified in claim 19, further comprising actuating a switching device serially connected to said driving device, said step of actuating providing a path for said electric current.

21. The method as specified in claim 19, further comprising:
   a) coupling a digit line to said significant node; and
   b) driving said digit line to said significant potential.

22. A method of driving a significant potential to a significant node comprising the following steps:
   a) connecting a supply potential to a supply node;
   b) creating a control potential at a control node;
   c) regulating a value of said control potential to control a value of said significant potential;
   d) actuating a driving device with said control potential in order to allow an electric current to flow between said significant node and said supply node; and
   e) limiting said control potential to a maximum value.

23. The method as specified in claim 22, wherein said step of limiting further comprises pumping said control node to a substantially stable potential.

24. The method as specified in claim 22, further comprising limiting said significant node potential to a maximum value in response to said maximum value of said control potential.

25. The method as specified in claim 22, further comprising adjusting said control potential with respect to changes in said supply potential.

26. The method as specified in claim 24, further comprising coupling a digit line to said significant node thereby limiting a maximum potential of said digit line.

27. A memory device for storing digital data, comprising:
   a) a memory cell for storing the digital data;
   b) a digit line for coupling the digital data to and from said memory cell;
   c) a supply node connectable to a supply potential having a high logic state;
   d) an N-type switching device, having a control input, electrically interposed between said digit line and said supply node; and
   e) a control circuit in electrical communication with said control input of said N-type switching device, said control circuit providing a control potential having a maximum value to said control input, a digit line potential of said digit lines having a digit line maximum potential equal to said maximum value of said control potential minus a threshold potential of said N-type switching device, said digit line maximum potential independent of changes in said supply potential.

28. The memory device as specified in claim 27, further comprising:
   a) a reference node connectable to a reference potential; and wherein
   b) said control circuit comprises a diode electrically interposed between said control input and said reference node, said maximum potential of said control input equal to a potential required to forward bias said diode.

29. The memory device as specified in claim 27, wherein said control circuit comprises a potential generator for generating a pumped potential at said control input, said pumped potential being said control potential, said pumped potential having a value necessary to actuate said N-type switching device.

30. The memory device as specified in claim 29, further comprising a P-type switching device serially connected to said N-type switching device and said digit line, said P-type switching device being fully conductive such as not to reduce a value of said maximum potential of said digit line.

31. A method for controlling a digit line potential, comprising the following steps:
   a) connecting a supply potential to a supply node;
   b) creating a control potential at a control node;
   c) regulating said control potential to have a maximum value; and
   d) limiting the digit line potential to a digit line maximum value, in response to said step of regulating, for a high logic state of said digit line potential.

32. The method as specified in claim 31, further comprising actuating an N-type switching device with said control potential, said digit line maximum value equal to said maximum value of said control potential minus a potential required to perform said step of actuating.

33. The method as specified in claim 31, further comprising clocking said control potential to said control node.

34. The method as specified in claim 31, further comprising applying said control potential to said control node substantially continuously.

35. The method as specified in claim 31, wherein said step of regulating further comprises adjusting said control potential with respect to changes in said supply potential for values of said control potential less than said maximum value.

36. The circuit as specified in claim 17, wherein said switching device experiences minimal potential loss when actuated.

37. The circuit as specified in claim 36, wherein said switching device experiences minimal potential loss when actuated.

* * * * *